United States Patent [19]

Royer et al.

[11] Patent Number: 5,043,992
[45] Date of Patent: Aug. 27, 1991

[54] LASER DRIVER WITH TEMPERATURE COMPENSATION

[75] Inventors: James J. Royer, Hanover Township, Northampton County; Kalpendu R. Shastri, Allentown, both of Pa.

[73] Assignee: AT&T Bell Laboratories, Murray Hill, N.J.

[21] Appl. No.: 417,994

[22] Filed: Oct. 6, 1989

[51] Int. Cl.[5] ............................................... H01S 3/00
[52] U.S. Cl. .......................................... 372/38; 372/29
[58] Field of Search ...................... 372/38, 29, 30, 31, 372/32

[56] References Cited

U.S. PATENT DOCUMENTS

| | | | |
|---|---|---|---|
| 4,243,952 | 6/1981 | Patterson | 331/94.5 |
| 4,359,773 | 11/1982 | Swartz et al. | 372/26 |
| 4,577,320 | 3/1986 | Yoshikawa et al. | 372/29 |
| 4,639,924 | 1/1987 | Tsunekawa | 372/33 |
| 4,733,398 | 3/1988 | Shibagaki et al. | 372/31 |

*Primary Examiner*—William L. Sikes
*Assistant Examiner*—Robert E. Wise
*Attorney, Agent, or Firm*—J. H. Fox

[57] ABSTRACT

A laser driver includes a reference circuit, which may be a bandgap reference, mounted in thermal contact with the laser. The reference produces a current component Iptat that is proporational to the absolute temperature. The modulation current is proportional to Iptat, which slowly with temperature, up to a certain junction temperature (e.g., 65 to 70 degrees C.). Above that temperature, the modulation current increases more rapidly by adding an additional current component Icomp. This provides for the required increase in modulation current to compensate for temperature variations in the laser output. This technique allows the laser to be operated without cooling (as by a thermoelectric cooler) in many applications. The laser driver may optionally include circuitry to provide a bias current, which may be controlled by a backface monitor or threshold detector.

22 Claims, 10 Drawing Sheets

LASER DRIVER WITH TEMPERATURE COMPENSATION

BACKGROUND OF THE INVENTION

1. Field of the Invention

This invention relates to a technique for compensating a modulated laser with respect to temperature variations.

2. Description of the Prior Art

High speed lightwave communication systems typically comprise a semiconductor laser that is modulated by a digital electrical signal. One important characteristic of the laser is the light output verses electrical drive current amplitude. It is known that this characteristic changes with respect to aging and temperature. That is, the threshold current, which is the current at which the lasing commences, generally increases as the laser ages, and as the temperature increases. This phenomenon is referred to as "threshold shift", and is illustrated in FIG. 10. The laser light output power (L) verses current through the laser (I) is shown for two temperatures, where $T2 > T1$. It can be seen that the threshold is greater at the higher temperature; that is, $Ith2 > Ith1$. Furthermore, the slope of the curve above threshold tends to decrease as the temperature of the laser increases. That is, the light output for a given current above threshold is less at the higher temperature. The ambient temperature variations may be quite large, and the laser and its drive circuitry may produce significant heat output. Therefore, the change in light output due to temperature changes is a significant consideration in the design of laser transmitter systems.

One known solution to the problem of temperature changes is to maintain the laser temperature relatively constant during operation. This stabilization may be accomplished by mounting the laser on a thermoelectric cooler (TEC). Within a certain ambient temperature range, this technique maintains the laser junction temperature constant, and provides thermal isolation between the laser and the driver circuitry, so that ambient temperature variations do not significantly increase the laser temperature. In this manner, the electrical drive current may be maintained at a relatively constant level during operation, while still obtaining constant light output. In addition, the use of a cooler helps to increase the longevity of the laser, and also helps maintain the wavelength of the laser at a constant value. However, these considerations are relatively less significant in some systems, especially with the increases in laser lifetimes that are being achieved with newer laser designs.

The electrical drive current for the laser is typically formed from two components, being a bias current and a modulation current having a constant amplitude. Referring to FIG. 10, the bias current (Ib1) is typically adjusted so as to maintain the laser just below threshold (i.e., off) in the absence of modulation current, at room temperature (T1). When the modulation current (Imod1) is on, the total drive current is then above threshold, so that the laser produces light output. In order to adjust the bias current to compensate for threshold shift, a "backface monitor" is typically used. This includes a photodetector mounted so as to receive a portion of the light output emitted from the back face of the laser diode. The electrical output of the photodetector is then used to control the bias current. Therefore, as the lasing threshold increases, as due to temperature increases or other factors, the bias current is increased so at to maintain total light output constant.

However, the use of backface monitoring does not solve the problem of laser output changes as a function of temperature, because that technique maintains only the total laser light output constant (e.g., at Lset). That is, in prior art designs, if the bias current is adjusted to be just below threshold at low temperatures, then the backface monitor tends to shift the bias current too high at high temperatures (Ib2), so that the laser does not turn fully off when no modulation signal is present. Therefore, the above-noted cooling technique has frequently been adopted, especially in high performance systems, to negate temperature effects on performance.

SUMMARY OF THE INVENTION

We have invented a technique for compensating a modulated laser for changes in light output due to temperature changes. In this technique, a reference circuit, typically a bandgap reference, is located in thermal proximity to the laser. A reference signal (current or voltage) that varies with temperature is derived from the reference. The reference signal is used to control the magnitude of the laser modulation current by generating two linearly varying current components. These components provides for the modulation current to increase slowly with temperature up to a given temperature, and more rapidly at temperatures higher than the given temperature.

DETAILED DESCRIPTION

Figure 10:
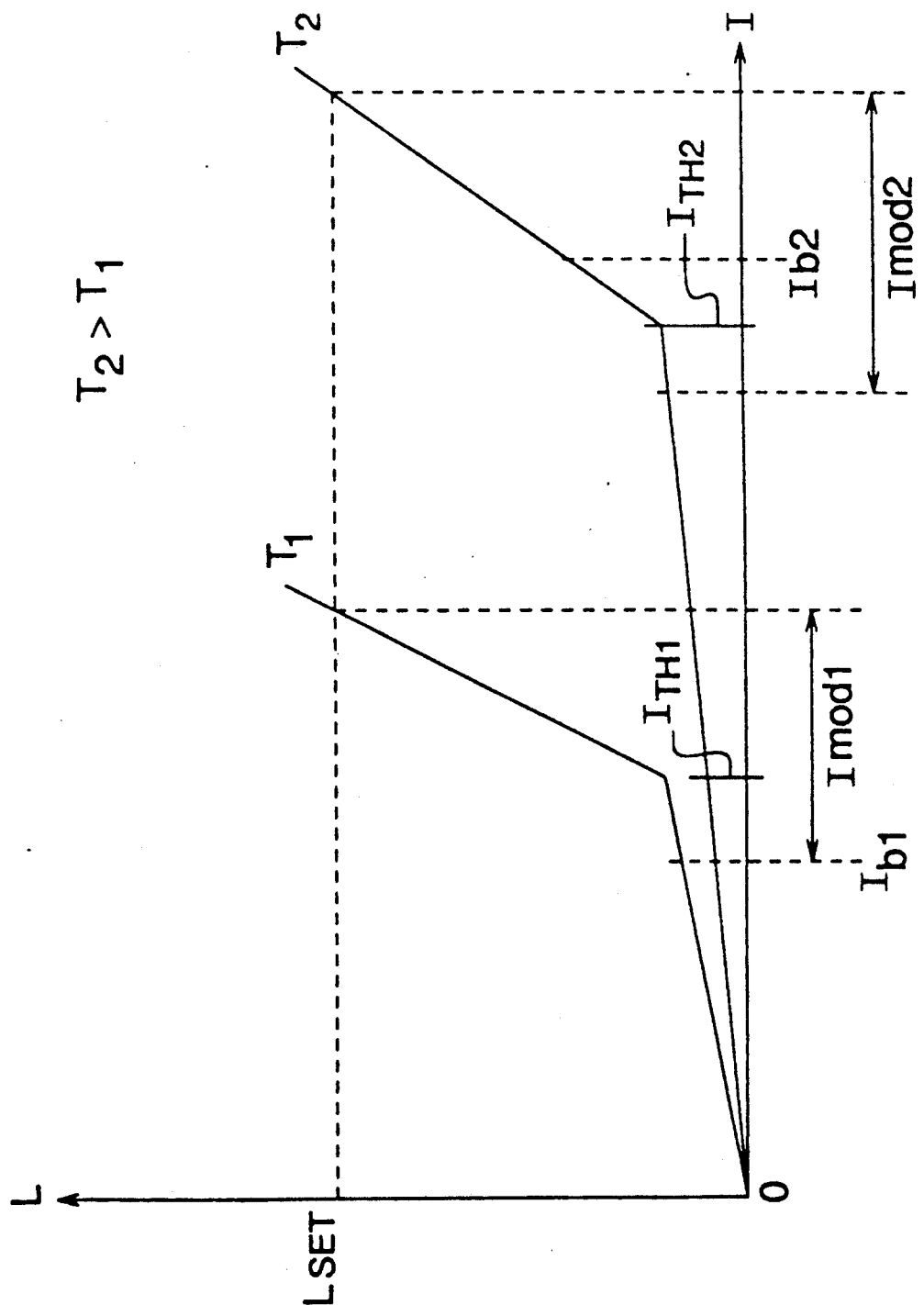
FIG. 10 shows the light output of a laser verses the electrical current flowing through the laser at two different temperatures.

This detailed description relates to a technique for improving the temperature compensation of semiconductor lasers. In this technique, the amplitude of the modulation current is increased as the laser temperature increases. Referring to FIG. 10, the increase in modulation is indicated by Imod2 (at temperature T2), which is greater than Imod1 (at temperature T1). This is accomplished by means of a reference circuit located in thermal proximity to the laser. As used herein, "thermal proximity" means that changes in temperature of the semiconductor laser junction are tracked by changes in junction temperature of the reference circuit. This may be accomplished by mounting the driver integrated circuit, which typically includes the reference circuit, near the laser. For example, in a hybrid integrated circuit formed on a ceramic substrate, a temperature difference of less than about 15 degrees C. is usually obtained in this manner. However, the laser and reference circuit may not be in physical proximity, but still in thermal proximity, as by coupling them with thermal pipes, etc.

Figure 1:
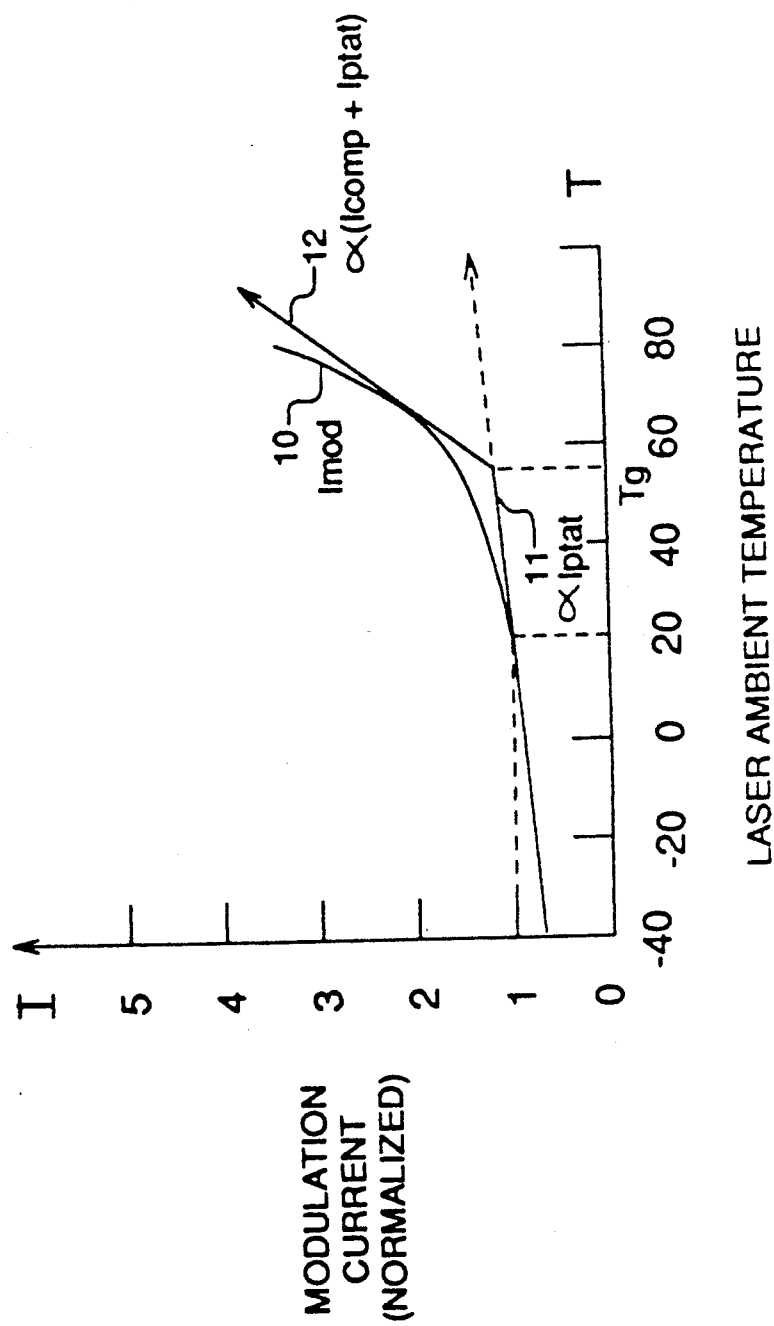
FIG. 1 shows the relative laser modulation current necessary to keep light output constant, as a function of temperature.

Referring to FIG. 1, the modulation current required to obtain a given light output is plotted with respect to the ambient laser temperature. The modulation current Imod (10) is normalized with respect to the current required at room temperature (20 degrees C.). The present inventive technique provides for approximating Imod through the use of two (or more) linear current regions (11, 12). We have discovered that these satisfactorily approximate Imod in typical applications, and may be generated with cost-effective circuitry. The first region (11), is a relatively slowly-varying function of absolute temperature, and is used for the lower temperature portion of the modulation current regime. It is proportional to a current referred to as Iptat herein. The second region (12), is a more rapidly varying function of temperature, and applies above a given temperature ($T_g$). This second region may be produced by adding to Iptat a more rapidly increasing current, referred to as the "compensation current" (Icomp) herein, since it compensates for laser effects at high temperature. In the illustrative case the "given" temperature $T_g$ at which the two linear components meet is about 65 to 70 degrees C. as measured at the driver integrated circuit substrate, which corresponds to about 50 to 55 degrees C. ambient in the package used, as shown in FIG. 1. The linear current components may be generated using low-cost integrated circuit techniques, by locating the current-generating circuitry in thermal proximity to the laser. An appropriate $T_g$ may be chosen for other lasers, with values typically being in the range of 40 to 90 degrees C. as measured at the driver integrated circuit substrate.

Figure 2:
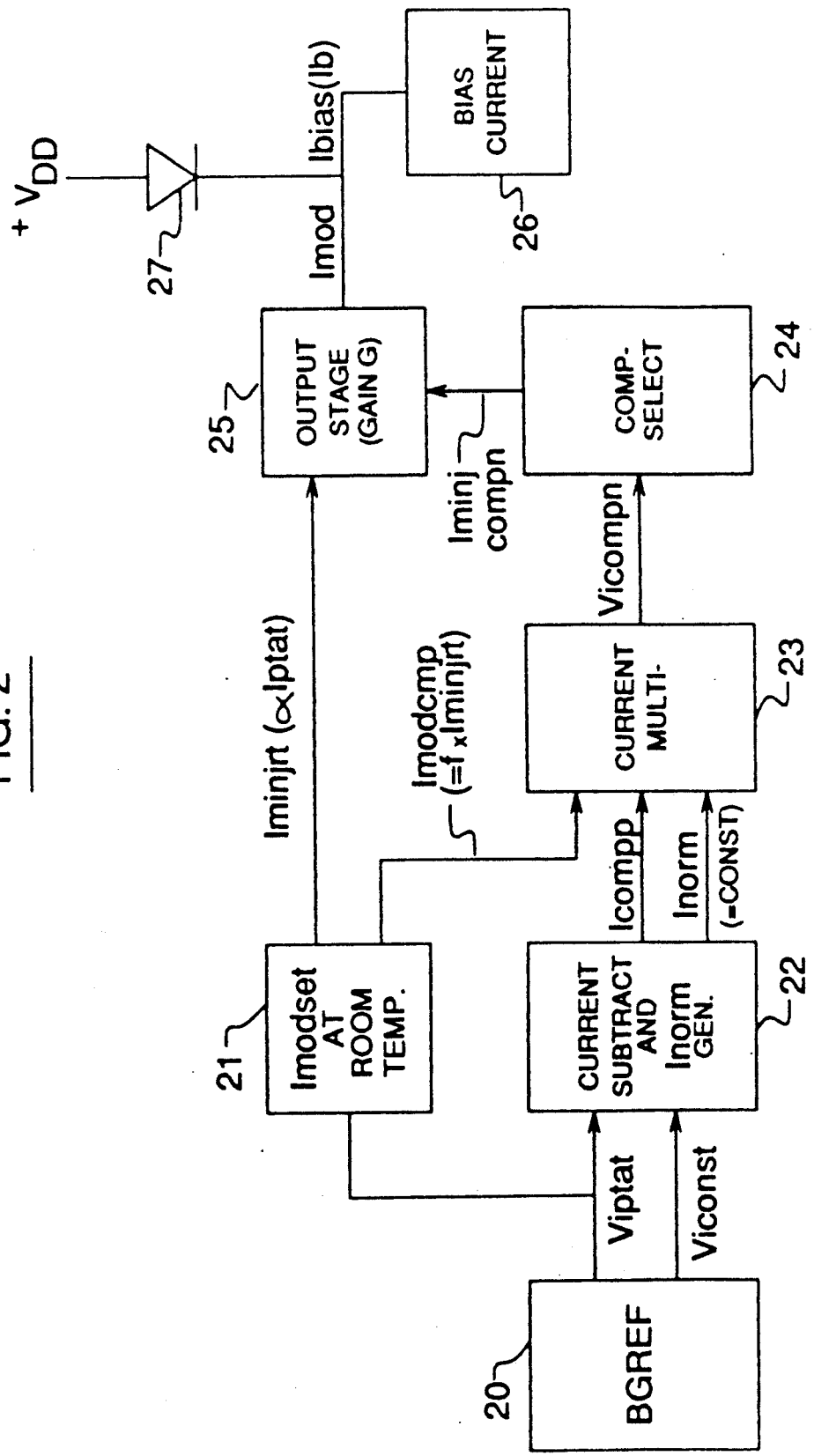
FIG. 2 shows a block diagram of an illustrative embodiment of the present invention.

Referring to FIG. 2, a block diagram of circuitry that may be used to implement the present invention is shown. The reference circuit 20 (BGREF) is a bandgap reference in the illustrative case. The signals generated by BGREF are voltages used to produce currents having the required temperature coefficients. The voltages Viconst is used for generating, in subsequent stages, a current Iconst that is constant with respect to temperature changes; i.e., has a zero temperature coefficient. The voltage Viptat is used for generating a current Iptat that increases with respect to temperature changes; i.e., has a positive temperature coefficient. The "Imodset" circuit 21 is used to set the value of the modulation current at a given temperature, being room temperature (e.g., 20 degrees C.) in the illustrative case. The "Current Subtract" circuit 22 subtracts the constant current Iconst from the temperature-dependent current Iptat, to generate a compensation current Icompp. The "Current Mult" circuit 23 is a current multiplier for normalizing the compensation current to the room temperature value. The "Comp Select" circuit 24 selects the magnitude of the compensation current according to the characteristics of the laser used. The "Output Stage" 25 combines the slowly-varying current (proportional to Iptat) with the more rapidly-varying current (proportional to Icomp), in order to generate the modulation current, Imod. Also shown is a "Backface Monitor" circuit 26, for generating a bias current Ibias. The modulation current and the bias current are added to drive the laser 27.

Figure 3:
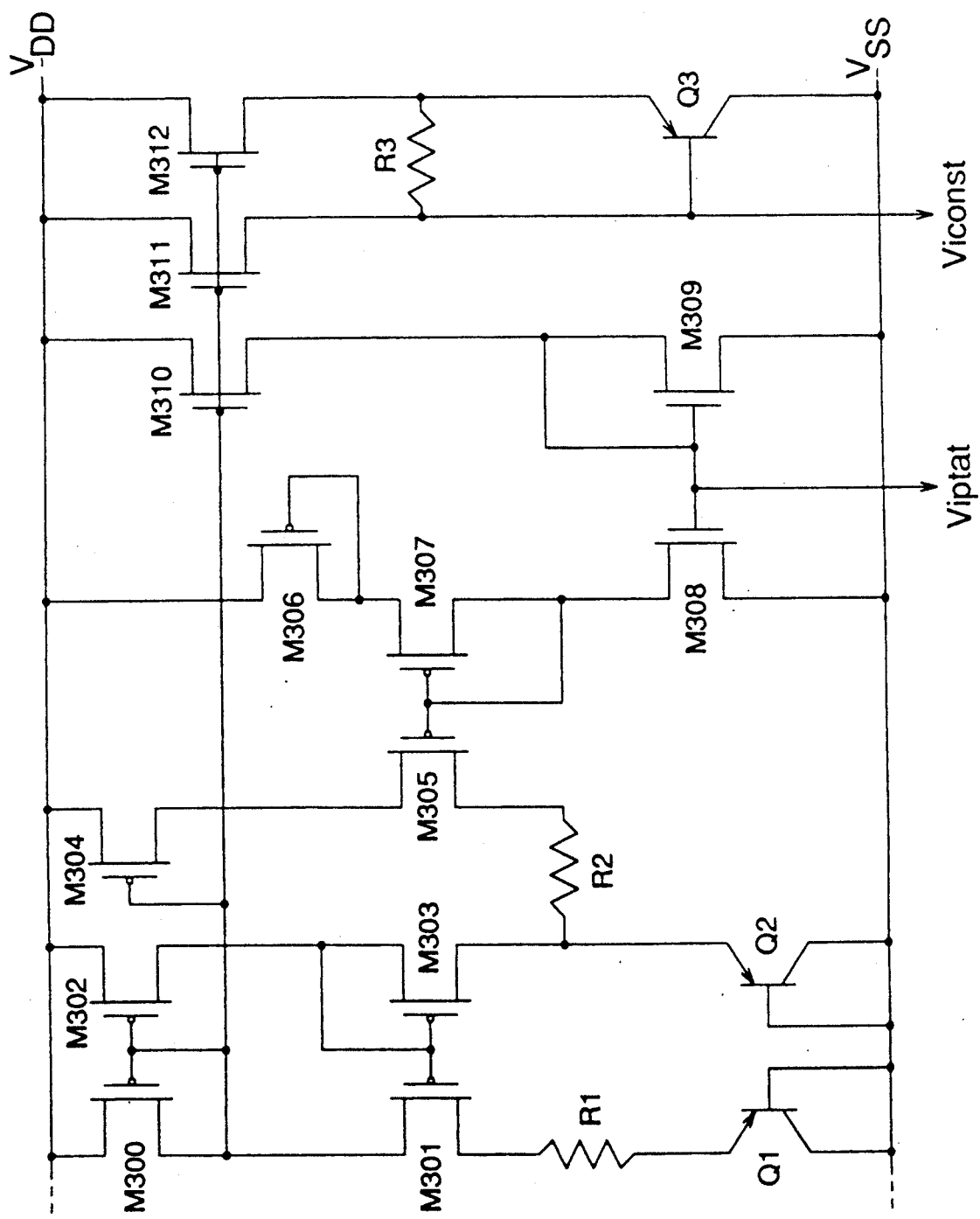
FIG. 3 shows a prior art bandgap reference circuit suitable for use with the inventive technique.

Referring to FIG. 3, a typical bandgap reference circuit, known in the prior art, is shown. This circuitry generates a voltage Viptat, which is used to generate the current Iptat. This is a current which is proportional to absolute temperature; that is, it has a positive temperature coefficient. The circuitry also generates a voltage Viconst, which is used to generate the current Iconst. This is a current which is constant with respect to temperature; that is, it has a zero temperature coefficient. If desired, additional voltages may be generated that are a constant value above Viptat and Viconst, in order to implement cascode current sources according to principles known in the art.

Figure 4:
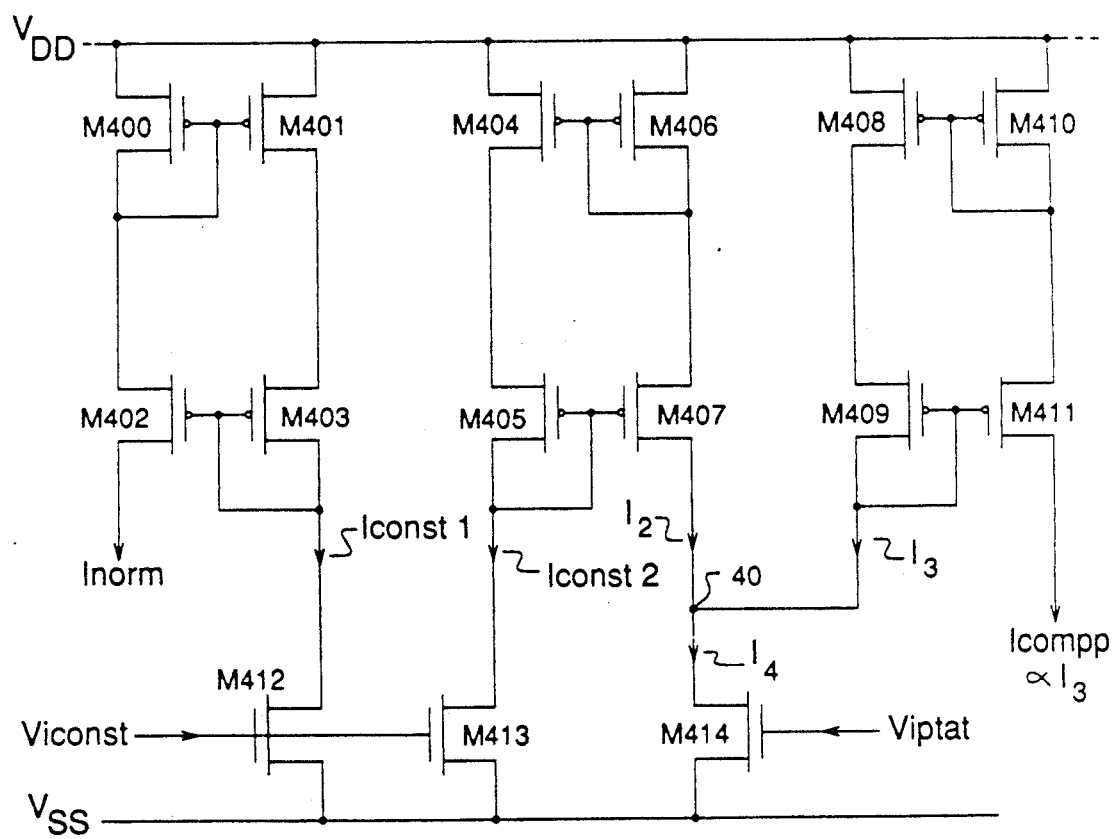
FIG. 4 shows circuitry for generating a linear current component, Icompp, that is zero below a given temperature and increases rapidly at higher temperatures.
Figure 4:
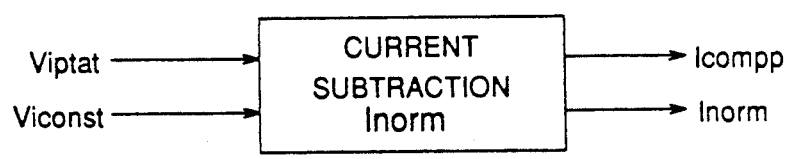

Referring to FIG. 4, the current subtraction circuitry is shown, which produces a compensation current Icompp that depends on the relative magnitudes of Iptat and Iconst. When Iptat is less than Iconst, which occurs at temperatures below the "given" temperature (e.g., below 50 degrees C. ambient in FIG. 1), the current Icompp is zero. However, when Iptat exceeds Iconst, which occurs at temperatures above the "given" temperature, then Icompp increases. Therefore, Icompp = 0 for $T < T_g$, and Icompp = k (Iptat − Iconst) for $T > T_g$, where k is a constant.

This is accomplished as follows: Viconst is applied to the gate of M413, to control the flow of Iconst2, being constant with respect to temperature. Transistors M404, M405, M406, M407 limit current I2 to a maximum value of Iconst2. At low temperatures, Viptat at the gate of M414 is relatively low, thereby limiting conduction through M407. Therefore, the voltage Vs (measured between node 40 and $V_{DD}$) remains low, and transistors M408, M409, M410, and M411 do not conduct, and Icompp = 0. At temperatures above the "given" temperature, Viptat increases to a level sufficiently high that M414 is capable of conducting more current I4 than can be supplied through M407. Therefore, current I3 begins to flow as node 40 is pulled down toward $V_{SS}$ and transistors M408, M409 start to conduct. The output current of this circuit, Icompp, is proportional to I3 due to the current mirror action of M408 ... M411. The value of Icompp can be chosen to be any desired multiple of I3, and is 4 times greater in the illustrative case, as determined by the relative sizes of M408-M409 to M410-M411. Note that the "given" temperature, at which Icompp begins to increase, may thus be chosen by selecting the relative sizes of transistors M407 and M414, since they determine when current I3 begins to flow.

In addition, in the circuit of FIG. 4, Viconst is applied to the gate of M412 to produce Iconst1. Transistors M400, M401, M402 and M403 form a current mirror to produce Inorm. This is a mirror of Iconst1, which is constant with respect to temperature. Hence, Inorm is also constant with respect to temperature, and is used for setting the constant of proportionality of the current multiplier circuit (FIG. 6).

Figure 5:
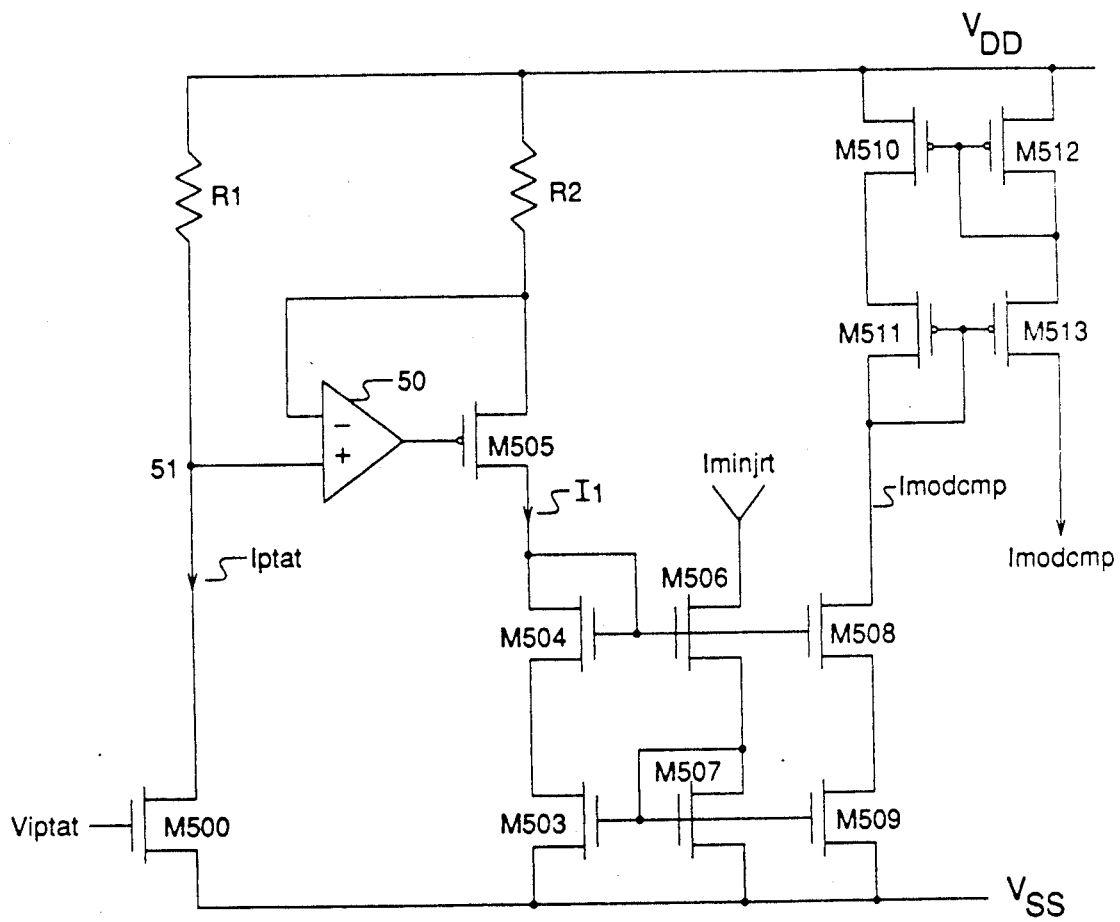
FIG. 5 shows circuitry for setting the value of the modulation current at room temperature.
Figure 5:
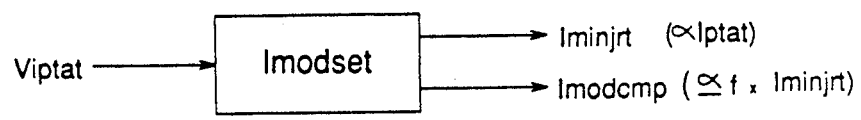

Referring to FIG. 5, the circuitry for setting the magnitude of the modulation current at room temperature is shown. This produces two output currents: Iminjrt and Imodcmp, which are proportional to Iptat, and hence to the absolute temperature. The current Iptat is set by Viptat at the gate of M500. Resistor R1 may be a tunable device (e.g., as by laser trimming). Operational amplifier 50 sets the voltage at the gate of M505 such that the voltage drop across R2 is the same as across R1. Hence, as R1 is tuned to a higher value, node 51 goes down in voltage, and M505 conducts more heavily, so that current I1 increases. This allows for conveniently setting the absolute value of I1 at a given temperature. Note that changes in I1 are proportional to changes in Iptat, and hence to changes in temperature. The current I1 is mirrored to produce Iminjrt and Imodcmp. The value of Imodcmp is f times Iminjrt, as is determined by the relative sizes of the transistors M506, M507, M508, M509, M510, M511, M512 and M513 in the current mirrors shown. This circuitry is useful for choosing the light output for a given application. For example, one present-day laser operating at a wavelength of 1.32 micrometers can be adjusted to have an light output ranging from $-14$ dbm to $-7$ dbm by adjusting R1.

Figure 6:
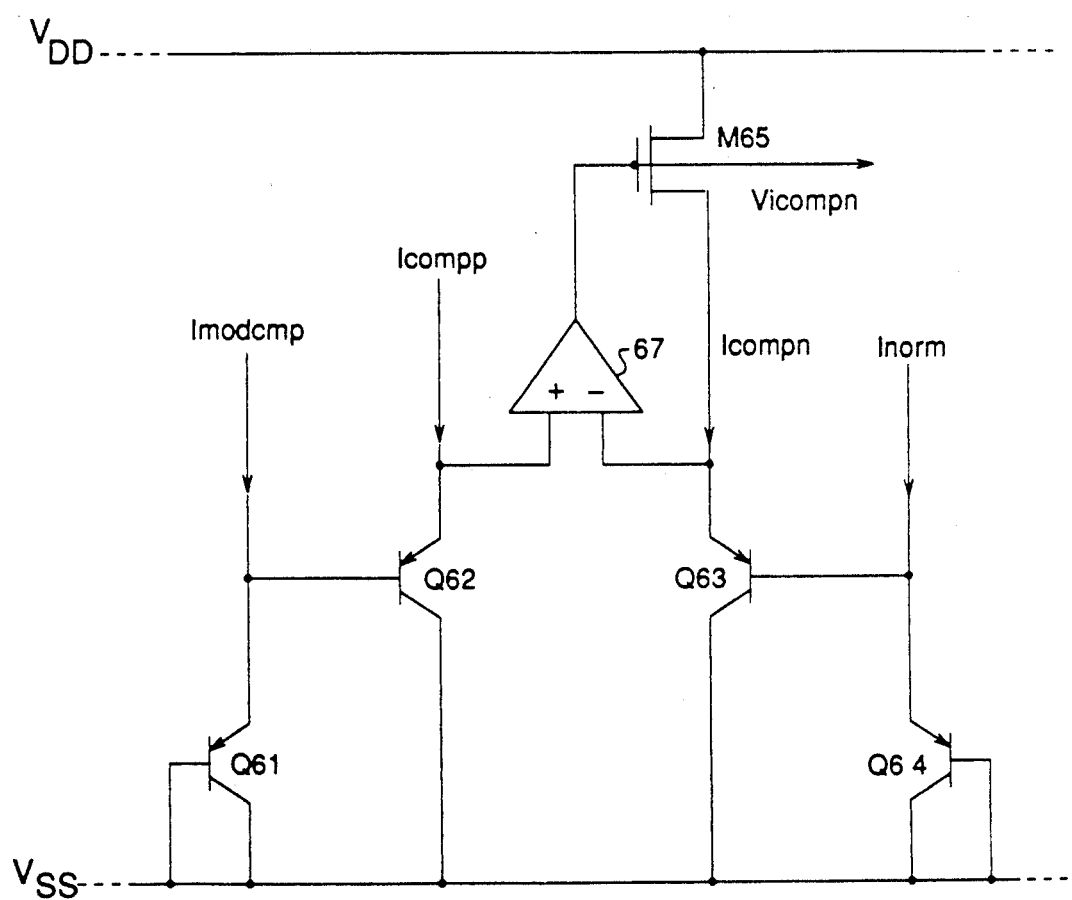
FIG. 6 shows a current multiplier for normalizing the temperature compensation signal to the room temperature value.

Referring to FIG. 6, a circuit for normalizing the compensation current is shown. This circuit is a current multiplier of a type known in the art that provides for implementing the function: Icompn=(Icomp-p×Imodcmp)/Inorm. This allows the compensation current Icompn to be set relative to Imodcmp. The degree of compensation is then determined by the value of Imodcmp, which is set by the Imodset circuitry of FIG. 5. The output of this circuit is a voltage Vicompn that generates currents proportional to Icompn in the circuitry of FIG. 7.

Figure 7:
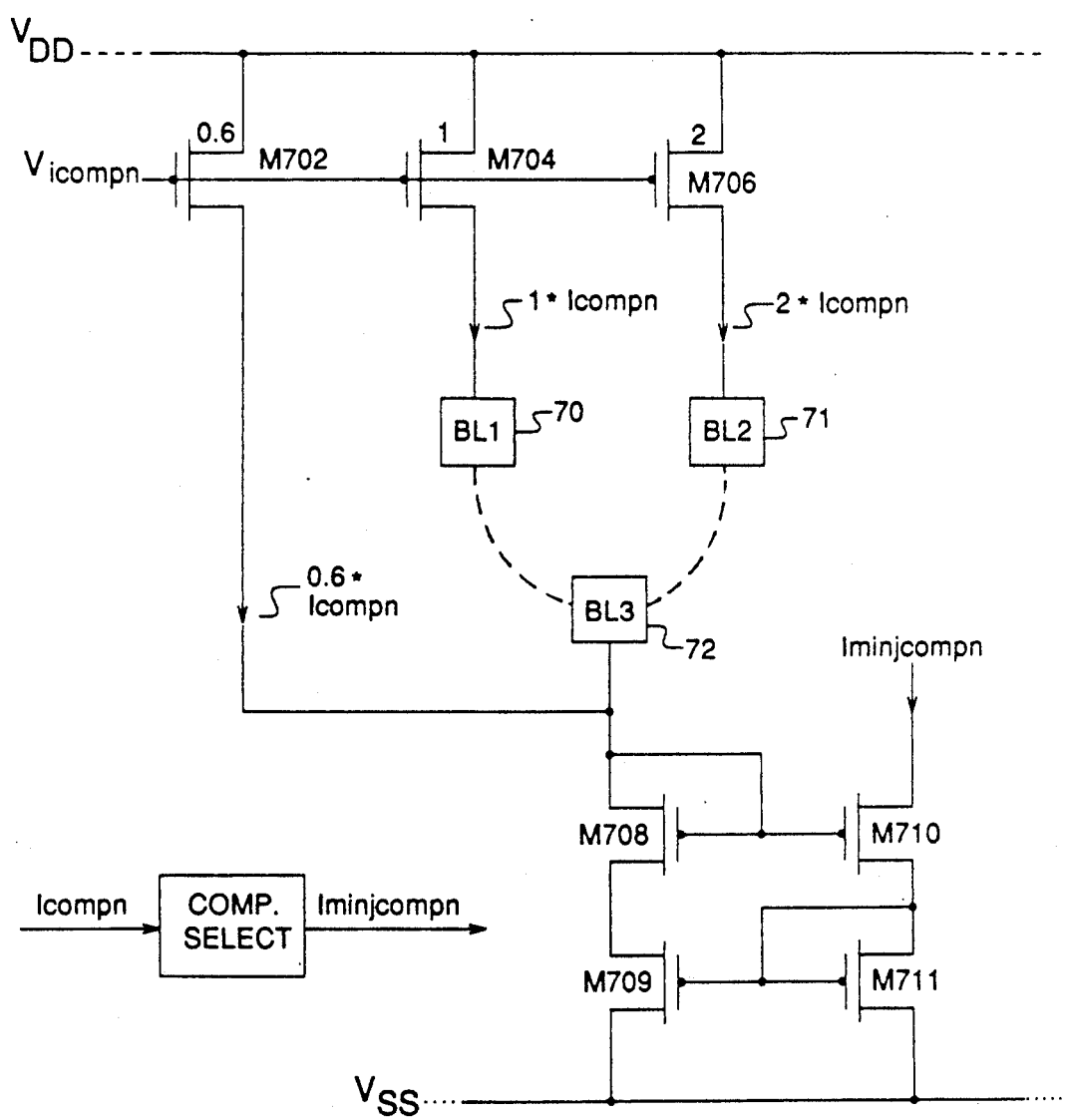
FIG. 7 shows circuitry for setting the value of the compensation (i.e., high temperature) current.

Referring to FIG. 7, a circuit for selecting the magnitude of the compensation current is shown. This allows for adjusting the slope of the compensation current in FIG. 1, and is typically accomplished during manufacture of a laser transmitter. In this manner, lasers having differing characteristics of light output verses temperature can be satisfactorily compensated. The compensation current voltage Vicompn (FIG. 6) controls the current though transistors M702, M704, and M706. The latter two may be included in parallel with M702 by performing a wire-bonding operation between pads 70-72 and 71-72. That is, when a minimum compensation current is desired, neither pad 70 nor 71 are connected to pad 72. Hence, only the current through M702 contributes to the output compensation current, Iminjcompn. When additional compensation current is required, either pad 70 or pad 71 may be connected to pad 72. For maximum compensation, both are connected. In the illustrative case, the size ratio of M702 (compared to M65 in FIG. 6) is 0.6, whereas it is 1.0 for M704, and 2.0 for M706. Therefore, the output current Iminjcompn, which is mirrored through M708, M709, M710 and M711, may have a relative value ranging from 0.6 Icompn (no pads connected) to 3.6 Icompn (both pads 70 and 71 connected to pad 72). Of course, other transistor size ratios may be used to provide for other compensation ranges.

Figure 8:
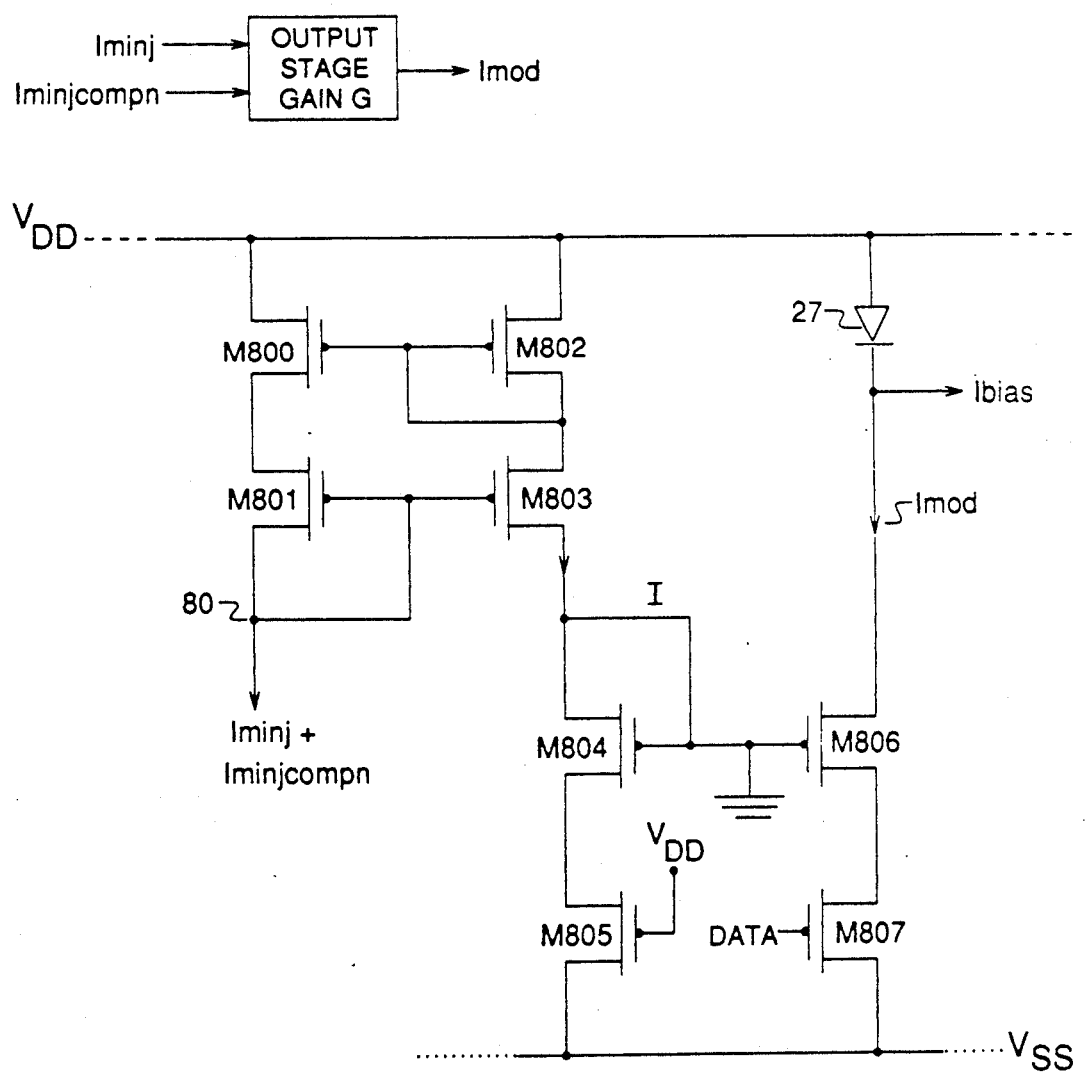
FIG. 8 shows output circuitry for modulating the laser.

Referring to FIG. 8, an output stage suitable for driving a laser diode 27 is shown. This circuit combines the slowly varying low temperature current Iminj with the more rapidly varying higher temperature current Iminjcompn. They are combined at node 80, producing a current that is mirrored by M800 ... M803 to produce a current Isum. The data signal D that electrically modulates the laser is applied to the gate of M807. The current Isum is therefore mirrored and modulated by M804 ... M807, to produce the modulation current Imod.

Figure 9:
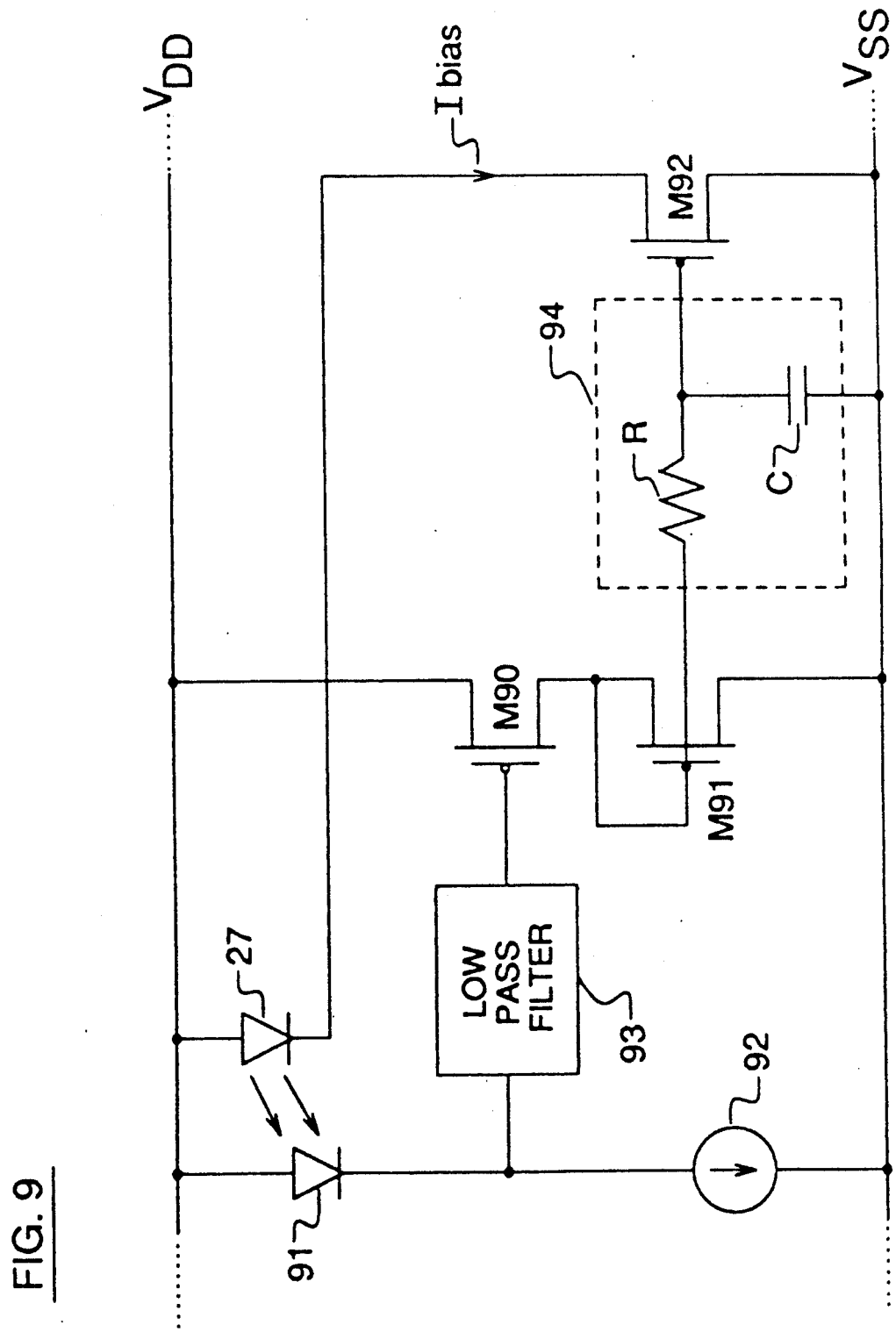
FIG. 9 shows an optional prior art backface signal monitoring circuit for setting the bias current.

Referring to FIG. 9, a backface monitoring circuit is shown that may be used to generate a bias current. A photodetector 91 optically coupled to the laser diode 27 produces a current signal that varies with the laser light output. This current signal is compared with a signal modulated by the data signal from current source 92, and filtered by low pass filter 93. This produces a signal that is compensated with respect to differing ratio's of 1's (laser on) and 0's (laser off) in the data. The compensated signal is applied to transistors M90 and M91, and thence to a second low pass filter 94, which provides a slowly-varying signal to M92. This generates the bias current Ibias that is added to the modulation current at the cathode of laser 27, producing the total current supplied to the laser.

Although two linear current regimes have been described above (i.e., above and below 65 degrees C. junction), still others are possible. That is, additional linear regions may be added to improve the piece-wise linear fit of the laser's temperature characteristics still more, if desired. For example, an additional current subtracting circuit analogous to that of FIG. 4 may be used to generate a still larger rate of current increase for the modulation current at some higher temperature. However, the two-piece linear fit of the illustrative embodiment has been found to be very satisfactory in one high-speed (600 megabit) lightwave system that utilizes optical fibers as the transmission medium. Furthermore, while a bandgap reference has been shown above for generating the reference signal, still other types of temperature-dependent reference circuits may be used. For example, a field effect transistor current source that may be used is described in U.S. Pat. No. 4,645,948 co-assigned with the present invention. A first one of these current sources may be used to generate a positive temperature coefficient current (comparable to Iptat), and a second one of these current sources used to generate a zero temperature coefficient signal (comparable to Iconst). Still other reference circuits are possible. Note also that instead of performing the above-noted circuit functions with currents, they may be performed with voltages. That is, Vptat, Vconst, etc. may be used in the subtracter, normalization, and other circuitry, with the modulation current being generated at a later stage.

Note that backface monitor circuitry has been shown above to adjust the bias current to compensate for threshold shift. That technique maintains the total light output constant. Therefore, as the temperature rises, the backface monitor increases the bias current, which may exceed threshold at high temperatures. The inventive modulation current control technique then increases the modulation current, in order to adequately turn off the laser, and hence preserve the extinction ratio. However, other threshold compensation schemes may be used with the inventive technique. For example, it is known to sense the voltage drop across the laser to determine the threshold shift. The bias current then may be maintained at a level just below threshold. It is also possible to utilize the present technique without any threshold compensation. That is, the bias current may be set at a constant value, or even eliminated entirely. That tends to limit the speed of operation, since the modulation current must be greater in magnitude. However, that may be acceptable in some systems, with the inventive technique then providing sufficient temperature compensation by itself.

The above illustrative embodiment has shown the laser driver as a silicon integrated circuit separate (but in thermal proximity to) the laser, which is typically formed of group III-V semiconductor materials. However, constructing the laser and its driver on the same integrated circuit is also possible. For example, both may be formed in the same III-V substrate. Alternatively, it is possible to use a silicon substrate in which the driver is fabricated, with a layer of III-V material epitaxially grown on the substrate for the laser. Note that the inventive technique requires only that the reference circuit (which controls Imod) be in thermal proximity to the laser. That is, the rest of the driver circuitry may be located on a separate integrated circuit not in thermal proximity to the laser, if desired. However, co-located circuitry is frequently the most cost-effective solution, due to the higher level of integration. Still other variations will be apparent to persons of skill in the art, and are included herein.

We claim:

1. A lightwave transmitter comprising a semiconductor laser and a driver circuit for modulating said laser with a modulation current,
characterized in that a reference circuit is located in thermal proximity to said laser, and includes means for increasing the magnitude of said modulation current as a function of temperature at a given rate up to a given temperature of said laser, and for increasing the magnitude of said modulation current at a more rapid rate at temperatures above said given temperature.

2. The lightwave transmitter of claim 1 wherein said driver circuit and said reference circuit are formed in the same integrated circuit.

3. The lightwave transmitter of claim 1 wherein said given rate is proportional to the absolute temperature of said reference.

4. The lightwave transmitter of claim 1 wherein said more rapid rate is proportional to the difference of said given rate and a constant.

5. The lightwave transmitter of claim 1 wherein said reference circuit is a bandgap reference.

6. The lightwave transmitter of claim 1 wherein said given temperature is in the range of 40 to 90 degrees C. as measured at said reference circuit.

7. The lightwave transmitter of claim 1 further comprising means for supplying a bias current to said laser.

8. The lightwave transmitter of claim 7 further comprising backface monitoring means for controlling said bias current so that the total optical output of said laser is maintained relatively constant.

9. The lightwave transmitter of claim 7 further comprising means for maintaining said bias current in proximity to the laser threshold current.

10. The lightwave transmitter of claim 1 further comprising means for adjusting the value of said more rapid rate, whereby lasers having differing characteristics of optical output verses temperature may be compensated.

11. The lightwave transmitter of claim 1 further comprising means for normalizing the magnitude of said modulation current to a value chosen at a given temperature, so that the optical power output of said laser may be chosen.

12. An integrated circuit for modulating a laser with a modulation current,
characterized in that said integrated circuit includes a reference circuit for increasing the magnitude of said modulation current as a function of temperature at a given rate up to a given temperature of said reference circuit, and for increasing the magnitude of said modulation current at a more rapid rate at temperatures above said given temperature.

13. The integrated circuit of claim 12 further comprising a driver circuit for supplying the modulation current to said laser.

14. The integrated circuit of claim 12 wherein said given rate is proportional to the absolute temperature of said reference.

15. The integrated circuit of claim 12 wherein said more rapid rate is proportional to the difference of said given rate and a constant.

16. The integrated circuit of claim 12 wherein said reference circuit is a bandgap reference.

17. The integrated circuit of claim 12 wherein said given temperature is in the range of 40 to 90 degrees C.

18. The integrated circuit of claim 12 further comprising means for supplying a bias current to said laser.

19. The integrated circuit of claim 18 further comprising backface monitoring means for controlling said bias current so that the total optical output of said laser is maintained relatively constant.

20. The integrated circuit of claim 18 further comprising means for maintaining said bias current in proximity to the laser threshold current.

21. The integrated circuit of claim 12 further comprising means for adjusting the value of said more rapid rate, whereby lasers having differing characteristics of optical output verses temperature may be compensated.

22. The integrated circuit of claim 12 further comprising means for setting the magnitude of said modulation current relative to a value chosen at a given temperature, so that the optical power output of said laser may be chosen.

* * * * *